United States Patent
Ko et al.

(10) Patent No.: US 8,947,942 B2
(45) Date of Patent: Feb. 3, 2015

(54) SEMICONDUCTOR MEMORY CHIP AND MULTI-CHIP PACKAGE USING THE SAME

(75) Inventors: Bok Rim Ko, Seoul (KR); Kwang Soon Kim, Mokpo-si (KR)

(73) Assignee: SK Hynix Inc., Gyeonggi-do (KR)

( * ) Notice: Subject to any disclaimer, the term of this patent is extended or adjusted under 35 U.S.C. 154(b) by 533 days.

(21) Appl. No.: 13/244,189

(22) Filed: Sep. 23, 2011

(65) Prior Publication Data

US 2012/0195089 A1 Aug. 2, 2012

(30) Foreign Application Priority Data

Jan. 27, 2011 (KR) .................. 10-2011-0008321

(51) Int. Cl.
*G11C 7/00* (2006.01)
*G11C 7/10* (2006.01)

(52) U.S. Cl.
CPC ............ *G11C 7/1045* (2013.01); *G11C 7/1012* (2013.01); *G11C 7/1084* (2013.01); *G11C 2207/105* (2013.01)
USPC ............ 365/189.02; 365/189.17; 365/230.03

(58) Field of Classification Search
CPC .. G11C 7/1045; G11C 7/1012; G11C 7/1084; G11C 2207/105
USPC ............. 365/189.02, 189.17, 230.02, 230.03; 711/5
See application file for complete search history.

(56) References Cited

U.S. PATENT DOCUMENTS

| 7,932,161 | B2 | 4/2011 | Apanius et al. | |
|---|---|---|---|---|
| 2004/0256638 | A1* | 12/2004 | Perego et al. | 257/200 |
| 2005/0169061 | A1* | 8/2005 | Sohn et al. | 365/189.03 |
| 2009/0273992 | A1* | 11/2009 | Kim et al. | 365/193 |

FOREIGN PATENT DOCUMENTS

KR     1020090114618 A     11/2009

* cited by examiner

*Primary Examiner* — J. H. Hur
(74) *Attorney, Agent, or Firm* — William Park & Associates Patent Ltd.

(57) ABSTRACT

A semiconductor memory chip includes a first pad unit configured to receive a first data and a first strobe signal, and a first selection transfer unit configured to transfer the first data and the first strobe signal to a first write path circuit in a first mode, and transfer the first data and the first strobe signal to a second write path circuit in a swap mode.

15 Claims, 6 Drawing Sheets

SEMICONDUCTOR MEMORY CHIP AND MULTI-CHIP PACKAGE USING THE SAME

CROSS-REFERENCES TO RELATED APPLICATIONS

The present application claims priority under 35 U.S.C 119(a) to Korean Application No. 10-2011-0008321 filed on Jan. 27, 2011 in the Korean intellectual property Office, and which is incorporated herein by reference in its entirety.

BACKGROUND

In general, a semiconductor memory chip utilizes a variety of data output modes such as X16 mode, X32 mode, etc. for inputting and outputting multiple bytes of data with one read or write command. In the X16 mode, 16 bits of data are inputted and outputted at the same time, and, in the X32 mode, 32 bits of data are inputted and outputted at the same time.

FIG. 1 is a diagram illustrating a conventional semiconductor memory chip configuration.

The conventional semiconductor memory chip in FIG. 1 includes a first pad unit 11, a second pad unit 12, a third pad unit 13, and a fourth pad unit 14. The first pad unit 11 includes first to eighth data pads DQ<1:8>, a first data strobe pad DS<1>, and a first data mask pad DM<1>. The second pad unit 12 includes ninth to 16th data pads DQ<9:16>, a second data strobe pad DS<2>, and a second data mask pad DM<2>. The third pad unit 13 includes 17th to 24th data pads DQ<17:24>, a third data strobe pad DS<3>, and a third data mask pad DM<3>. The fourth pad unit 14 includes 25th to 32nd data pads DQ<25:32>, a fourth data strobe pad DS<4>, and a fourth data mask pad DM<4>.

A conventional semiconductor memory chip configured in such a manner would utilize some or all of the first to fourth pad units 11 to 14 to input and output data according to a data input/output mode in effect. For example, the standards of Joint Electron Device Engineering Council (JEDEC) specify that data are to be inputted and outputted through the first to fourth pad units 11 to 14 in the X32 mode or through the second and third pad units 12 and 13 in the X16 mode.

With the development of the semiconductor industry, electronic devices have been miniaturized for reduction in size and weight. Multi-chip packaging is one of the techniques used for miniaturizing electronic devices. A multi-chip package is a package formed by mounting a plurality of semiconductor memory chips on a lead frame. Multi-chip packaging is frequently used to reduce the mounting area and the weight of, for example, mobile devices such as mobile phones or the like.

FIG. 2 is a diagram illustrating a multi-chip package configuration using the conventional semiconductor chip illustrated in FIG. 1.

Referring to FIG. 2, the multi-chip package 15 includes a first semiconductor chip 16 and a second semiconductor chip 17. In order to implement the multi-chip package 15 operating in the X32 mode, both the first and second semiconductor chips 16 and 17 operate in the X16 mode. Therefore, a pad unit 161 of the first semiconductor chip 16 and a pad unit 171 of the second semiconductor chip 17 should be bonded to a pad unit 151 of the multi-chip package 15.

When the first and second semiconductor memory chips 16 and 17 operate in the X16 mode, data are inputted and outputted through a pad unit positioned in the center of the first and second semiconductor chips 16 and 17. Accordingly, it can be seen that coupling the pad unit 161 of the first semiconductor memory chip 16 to the pad unit 151 of the multi-chip package 15 may create difficulties in packaging. Furthermore, different loading difference will also occur between the signals transferred through the bonding wires coupling the pad unit 161 of the first semiconductor memory chip 16 to the pad unit 151 of the multi-chip package 15 and the signals transferred through the bonding wires coupling the pad unit 171 of the second semiconductor memory chip 17 to the pad unit 151 of the multi-chip package 15.

SUMMARY

An embodiment of the present invention relates to a semiconductor memory chip capable of reducing a number of loading differences between signals transferred through bonding wires coupling semiconductor memory chips to pads of a multi-chip package.

In one embodiment, a semiconductor memory chip includes a first pad unit configured to receive a first data and a first strobe signal and a first selection transfer unit configured to transfer the first data and the first strobe signal to a first write path circuit in a first mode, and transfer the first data and the first strobe signal to a second write path circuit in a swap mode.

In another embodiment, a semiconductor memory chip includes a first multiplexer configured to multiplex data from a memory core and output the multiplexed data to a first pad unit through a first read path circuit in a first mode and a swap mode. A first selection transfer unit is configured to transfer a first data and a first strobe signal, which are inputted through the first pad unit, to a first write path circuit in the first mode, and transfer the first data signal and the first strobe signal to a second write path circuit in the swap mode.

In another embodiment, a multi-chip package configured to receive a first, second, third, and fourth data and a first, second, third, and fourth strobe signals includes a first semiconductor memory chip and a second semiconductor memory chip with similar functionality. Each semiconductor memory chip comprises a first selection transfer unit, a second selection transfer unit, a first write path circuit, a second write path circuit, a first pad unit, and a second pad unit.

In the first semiconductor memory chip, the first selection transfer unit is configured to transfer the first data and the first strobe signal, which are inputted through the first pad unit, to the first write path circuit in a first mode, and transfer the first data and the first strobe signal to the second write path circuit in a swap mode. The second selection transfer unit is configured to transfer the second data and the second strobe signal, which are inputted through the second pad unit, to the second write path circuit in the first mode and a second mode.

In the second semiconductor memory chip, the first selection transfer unit is configured to transfer a third data signal and a third strobe signal, which are inputted through the first pad unit, to the first write path circuit in the first mode, and transfer the third data signal and the third strobe signal to the second write path circuit in the swap mode. The second selection transfer unit is configured to transfer the fourth data and the fourth strobe signal, which are inputted through the second pad unit, to the second write path circuit in the first and second modes. A package pad unit that may be used as an I/O interface for the multi-chip package is coupled to the first and second pad units of each of the first and second semiconductor memory chips.

A method of writing to a multi-chip package may comprise transferring, in a first semiconductor memory chip, a first and a fourth sets of data from a first four sets of data received by the multi-chip package to a first and a second sets of I/O nodes of a memory core interface of the first semiconductor memory chip. The method may further comprise transferring, in a second semiconductor memory chip, a second and a third sets of data from the first four sets of data received by the multi-chip package to a first and a second sets of I/O nodes of a memory core interface of the second semiconductor memory chip.

Furthermore, in the first semiconductor memory chip, the first and the fourth sets of data from a second four sets of data received by the multi-chip package may be transferred to a third and a fourth sets of I/O nodes of the memory core interface of the first semiconductor memory chip. And in the second semiconductor memory chip, the second and the third sets of data from the second four sets of data received by the multi-chip package may be transferred to a third and a fourth sets of I/O nodes of the memory core interface of the second semiconductor memory chip.

A method of reading from a multi-chip package may comprise transferring, in a first semiconductor memory chip, a first and a second sets of data of four sets of data received from a memory core of the first semiconductor memory chip to a first and a fourth sets of I/O nodes of the multi-chip package. The method may further comprise transferring, in a second semiconductor memory chip, a first and a second sets of data of four sets of data received from a memory core of the second semiconductor memory chip to a second and a third sets of I/O nodes of the multi-chip package.

The method may further comprise transferring, in the first semiconductor memory chip, a third and a fourth sets of data of the four sets of data received from the memory core of the first semiconductor memory chip to the first and the fourth sets of I/O nodes of the multi-chip package. Furthermore, the method may comprise transferring, in the second semiconductor memory chip, a third and a fourth sets of data of the four sets of data received from the memory core of the second semiconductor memory chip to the second and the third sets of I/O nodes of the multi-chip package.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Embodiments of the present invention will be described with reference to accompanying drawings. However, the embodiments are for illustrative purposes only and are not intended to limit the scope of the invention.

Figure 1:
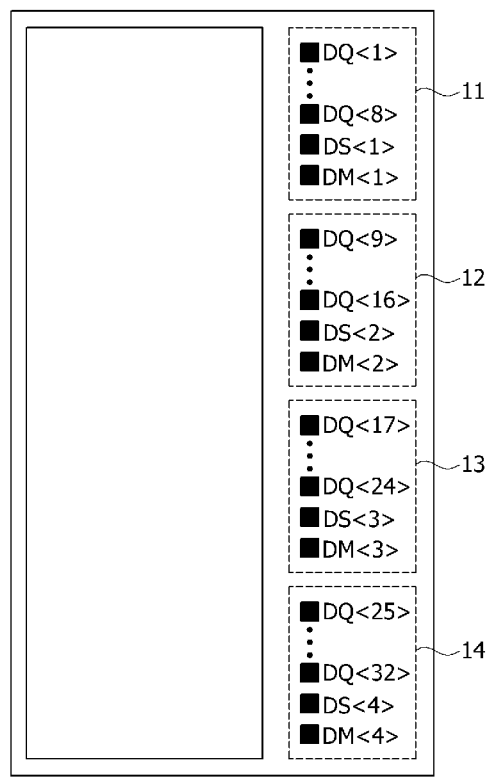
FIG. 1 is a diagram illustrating a conventional semiconductor memory chip configuration.
Figure 2:
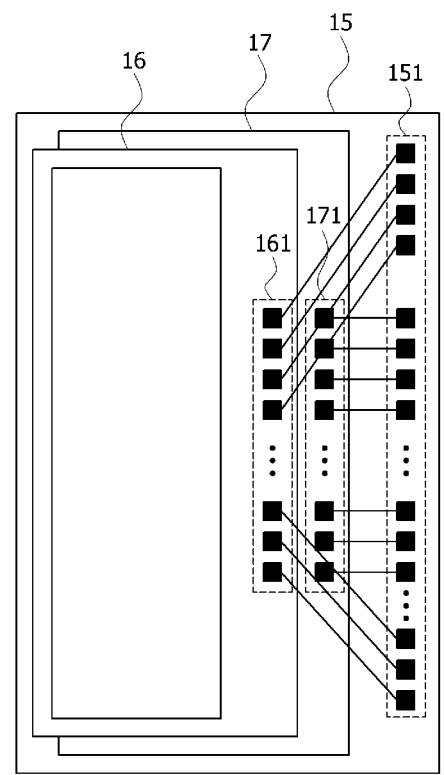
FIG. 2 is a diagram illustrating a multi-chip package using the semiconductor memory chip configuration of FIG. 1.
Figure 3:
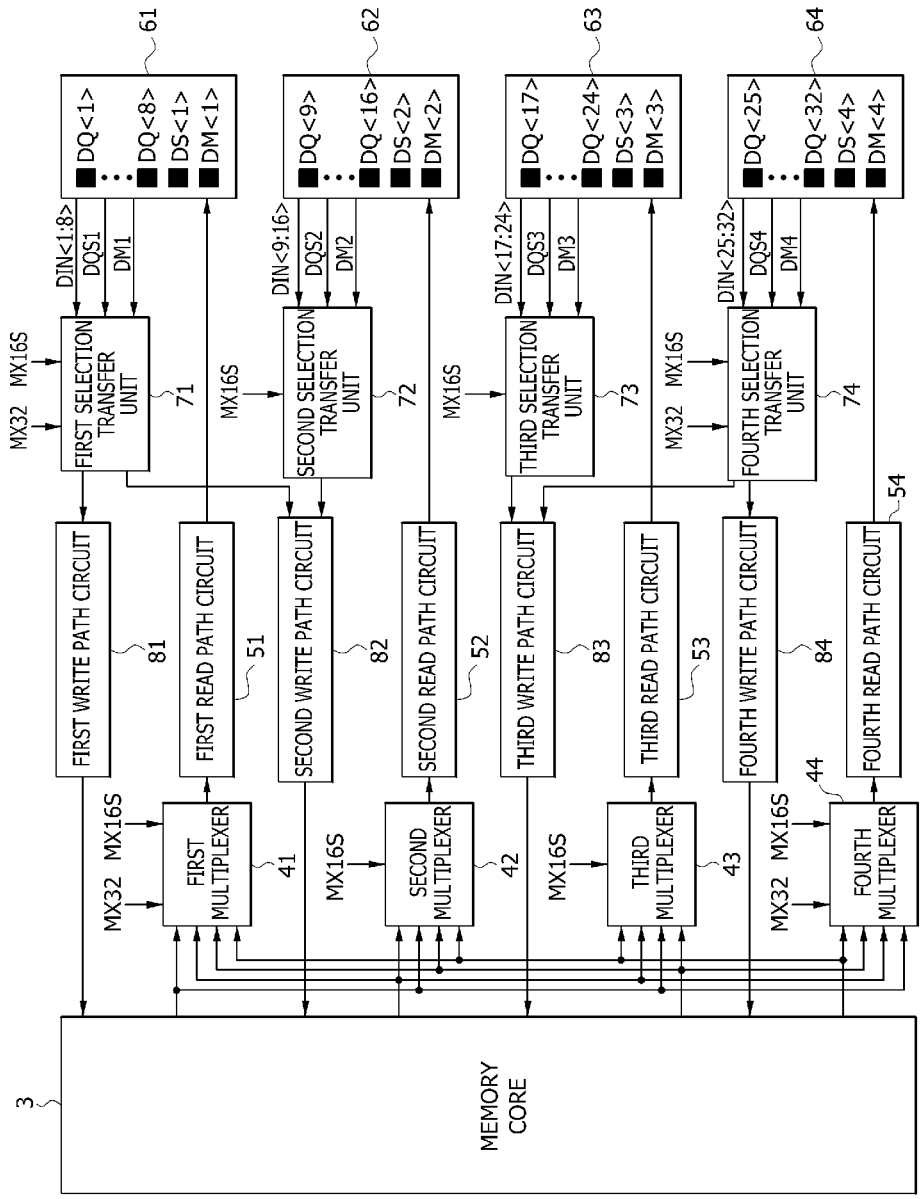
FIG. 3 is a diagram illustrating a semiconductor memory chip in accordance with an embodiment of the present invention.

FIG. 3 is a diagram illustrating a semiconductor memory chip in accordance with an embodiment of the present invention.

Referring to FIG. 3, a semiconductor memory chip in accordance with an embodiment of the present invention includes a memory core 3, a first multiplexer 41, a second multiplexer 42, a third multiplexer 43, a fourth multiplexer 44, a first read path circuit 51, a second read path circuit 52, a third read path circuit 53, a fourth read path circuit 54, a first pad unit 61, a second pad unit 62, a third pad unit 63, a fourth pad unit 64, a first selection transfer unit 71, a second selection transfer unit 72, a third selection transfer unit 73, a fourth selection transfer unit 74, a first write path circuit 81, a second write path circuit 82, a third write path circuit 83, and a fourth write path circuit 84.

The memory core 3 includes memory cell arrays for storing data, bit line sense amplifiers, and so on.

Table 1 lists three modes of data operation—X16 mode, X32, mode, and swap mode—the signals used to enter the various modes, and operation of the multiplexers MUX41, MUX42, MUX43, and MUX44 in the various modes.

TABLE 1

| MX16S | MX32 | Mode | MUX41 | MUX42 | MUX43 | MUX44 |
|---|---|---|---|---|---|---|
| Deassert | Deassert | X16 | No mux | MUX | MUX | No mux |
| Deassert | Assert | X32 | MUX | MUX | MUX | MUX |
| Assert | Deassert | Swap | MUX | No mux | No mux | MUX |
| Assert | Assert | Invalid | — | — | — | — |

In the X16 mode, both the swap mode signal MX16S and the X32 mode signal MX32 are deasserted to simultaneously input or output 16 bits of data through the second and third pad units 62 and 63. In the X32 mode, the swap mode signal MX16S is disabled and the X32 mode signal MX32 is enabled to simultaneously input or output 32 bits of data via the first through pad units 61, 62, 63, and 64. In the swap mode, the swap mode signal MX16S is enabled and the X32 mode signal MX32 is disabled to simultaneously input or output 16 bits of data through the first and fourth pad units 61 and 64. In some embodiments of the invention, assertion of both the swap mode signal MX16S and the X32 mode signal MX32 is an invalid operation, and should not be allowed to happen. However, other embodiments of the invention may allow assertion of both signals, either as one of the existing modes or as a new mode not described here but whose concepts are similar to the embodiments disclosed here.

The first multiplexer 41 is configured to multiplex received data from the memory core 3 and transmit the multiplexed data to the first read path circuit 51, when a read operation is performed with the X32 mode signal MX32 or the swap mode signal MX16S enabled (see Table 1). The first read path circuit 51 includes an input and output line (not shown), an input and output line amplification circuit (not shown), a pipe latch (not shown), and so on, and is configured to output the data transmitted from the first multiplexer 41 to the first pad unit 61.

The first multiplexer 41 is stopped from transmitting data during a X16 mode read operation when the X32 mode signal MX32 and the swap mode signal MX16S are deasserted (see Table 1).

The second multiplexer 42 is configured to multiplex received data from the memory core 3 and transmit the multiplexed data to the second read path circuit 52 for either a X16 mode read operation or a X32 mode read operation when the swap mode signal MX16S is deasserted (See Table 1). The second read path circuit 52 includes an input and output line (not shown), an input and output line amplification circuit (not shown), a pipe latch (not shown) and so on, and is configured to output the data transmitted from the second multiplexer 42 to the second pad unit 62. The second multiplexer 42 is stopped from transmitting data during a swap mode read operation when the swap mode signal MX16S is asserted and the X32 mode signal MX32 is deasserted (see Table 1).

The third multiplexer 43 is configured to multiplex received data from the memory core 3 and transmit the multiplexed data to the third read path circuit 53 for either a X16 mode read operation or a X32 mode read operation when the swap mode signal MX16S is deasserted (see Table 1). The third read path circuit 53 includes an input and output line (not shown), an input and output line amplification circuit (not shown), a pipe latch (not shown) and so on, and is configured to output the data transmitted from the third multiplexer 43 to the third pad unit 63. The third multiplexer 43 is stopped from transmitting data during the swap mode read operation when the swap mode signal MX16S is asserted and the X32 mode signal MX32 is deasserted (see Table 1).

The fourth multiplexer 44 is configured to multiplex received data from the memory core 3 and transmit the multiplexed data to the fourth read path circuit 54, when a read operation is performed with the X32 mode signal MX32 or the swap mode signal MX16S asserted (see Table 1). The fourth read path circuit 54 includes an input and output line (not shown), an input and output line amplification circuit (not shown), a pipe latch (not shown) and so on, and is configured to output the data transmitted from the fourth multiplexer 44 to the fourth pad unit 64. The fourth multiplexer 44 is stopped from transmitting during the X16 mode read operation when the X32 mode signal MX32 and the swap mode signal MX16S are deasserted (see Table 1).

The first pad unit 61 includes first to eighth data pads DQ<1:8> through which eight bits of data are inputted and outputted, a first data strobe pad DS<1> to which a first data strobe signal DQS1 is inputted, and a first data mask pad DM<1> to which a first data mask signal DM1 is inputted. The second pad unit 62 includes ninth to 16th data pads DQ<9:16> through which eight bits of data are inputted and outputted, a second data strobe pad DS<2> to which a second data strobe signal DQS2 is inputted, and a second data mask pad DM<2> to which a second data mask signal DM2 is inputted. The third pad unit 63 includes 17th to 24th data pads DQ<17:24> through which eight bits of data are inputted and outputted, a third data strobe pad DS<3> to which a third data strobe signal DQS3 is inputted, and a third data mask pad DM<3> to which a third data mask signal DM3 is inputted. The fourth pad unit 64 includes 25th to 32nd data pads DQ<25:32> through which eight bits of data are inputted and outputted, a fourth data strobe pad DS<4> to which a fourth data strobe signal DQS4 is inputted, and a fourth data mask pad DM<4> to which a fourth data mask signal DM4 is inputted.

Figure 4:
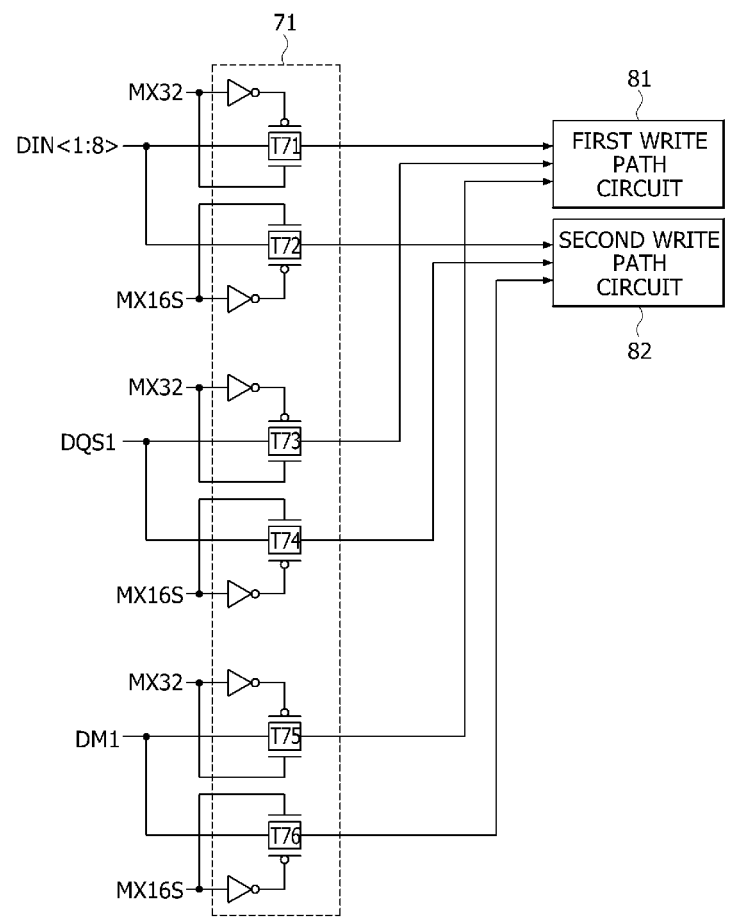
FIG. 4 is a diagram illustrating a first selection transfer unit included in the semiconductor memory chip of FIG. 3.

The first selection transfer unit 71 is configured to transmit eight bits of input data DIN<1:8>, the first data strobe signal DQS1, and the first data mask signal DM1, which are inputted through the first pad unit 61, to the first write path circuit 81 when a write operation is performed in the X32 mode or to the second write path circuit 82 when a write operation is performed in the swap mode. More specifically, referring to FIG. 4, the first selection transfer unit 71 transmits the eight bits of input data DIN<1:8>, the first data strobe signal DQS1, and the first data mask signal DM1 to the first write path circuit 81, when a write operation is performed in the X32 mode by transfer gates T71, T73, and T75 which are turned on by receiving the X32 mode signal MX32 enabled at a logic high level. Furthermore, the first selection transfer unit 71 transmits the eight bits of input data DIN<1:8>, the first data strobe signal DQS1, and the first data mask signal DM1 to the second write path circuit 82, when a write operation is performed in the swap mode by transfer gates T72, T74, and T76 which are turned on by receiving the swap mode signal MX16S enabled at a logic high level.

Figure 5:
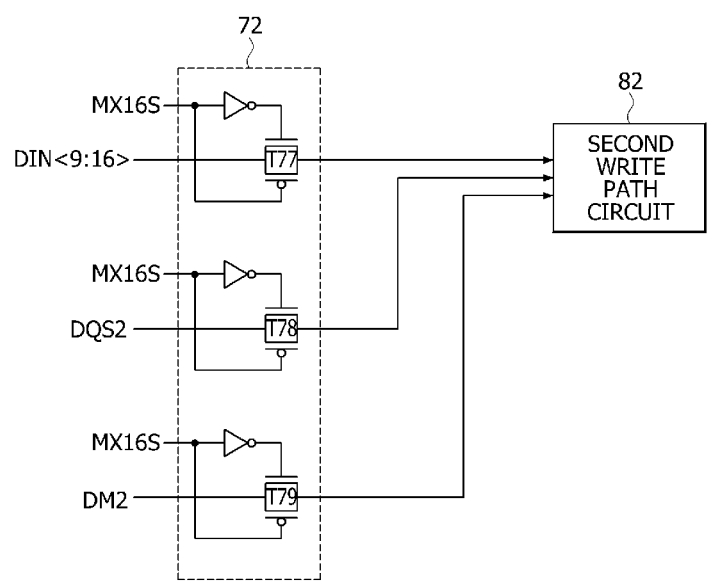
FIG. 5 is a diagram illustrating a second selection transfer unit included in the semiconductor memory chip of FIG. 3.

The second selection transfer unit 72 is configured to transmit eight bits of input data DIN<9:16>, the second data strobe signal DQS2, and the second data mask signal DM2, which are inputted through the second pad unit 62, to the second write path circuit 82 when a write operation is performed in the X16 mode or the X32 mode. More specifically, referring to FIG. 5, the second selection transfer unit 72 transmits the eight bits of input data DIN<9:16>, the second data strobe signal DQS2, and the second data mask signal DM2 to the second write path circuit 82, when a write operation is performed in the X16 mode or the X32 mode by transfer gates T77, T78, and T79 which are turned on by receiving the swap mode signal MX16S disabled at a logic low level. When a write operation is performed in the swap mode, the transfer gates T77, T78, and T79 are turned off. Therefore, the second transfer unit 72 stops an operation of transmitting the eight bits of input data DIN<9:16>, the second data strobe signal DQS2, and the second data mask signal DM2 to the second write path circuit 82.

The third selection transfer unit 73 is configured to transmit eight bits of input data DIN<17:24>, the third data strobe signal DQS3, and the third data mask signal DM3, which are inputted through the third pad unit 63, to the third write path circuit 83, when a write operation is performed in the X16 mode or X32 mode. The third selection transfer unit 73 may transmit the eight bits of input data DIN<17:24>, the third data strobe signal DQS3, and the third data mask signal DM3 to the third write path circuit 83, when a write operation is performed in the X16 mode or the X32 mode. Although a detailed drawing is not shown, the third selection transfer unit 73 may be similar to the second selection transfer unit 72 shown in FIG. 5. Accordingly, the operation of the third selection transfer unit 73 is similar to the operation of the second selection transfer unit 72.

The fourth selection transfer unit 74 is configured to transmit eight bits of input data DIN<25:32>, the fourth data strobe signal DQS4, and the fourth data mask signal DM4, which are inputted through the fourth pad unit 64, to the fourth write path circuit 84 when a write operation is performed in the X32 mode or to the third write path circuit 83 when a write operation is performed in the swap mode. The fourth selection transfer unit 74 may transmit the eight bits of input data DIN<25:32>, the fourth data strobe signal DQS4, and the fourth data mask signal DM4 to the first write path circuit 84, when a write operation is performed in the X32 mode. Although a detailed drawing is not shown, the fourth selection transfer unit 74 may be similar to the first selection transfer unit 71 shown in FIG. 4. Accordingly, the operation of the fourth selection transfer unit 74 is similar to the operation of the first selection transfer unit 71.

The first write path circuit 81 is configured to write the eight bits of input data DIN<1:8> transmitted from the first selection transfer unit 71 to the memory core 3 in synchronization with the first data strobe signal DQS1 and the first data mask signal DM1, when a write operation is performed in the X32 mode.

The second write path circuit 82 is configured to write the eight bits of input data DIN<1:8> transmitted from the first selection transfer unit 71 to the memory core 3 in synchronization with the first data strobe signal DQS1 and the first data mask signal DM1, when a write operation is performed in the swap mode. The second write path circuit 82 is also configured to write the eight bits of input data DIN<9:16> transmitted from the second selection transfer unit 72 to the memory core 3 in synchronization with the second data strobe signal DQS2 and the second data mask signal DM2, when a write operation is performed in the X16 or X32 mode.

The third write path circuit 83 is configured to write the eight bits of input data DIN<25:32> transmitted from the fourth selection transfer unit 74 to the memory core 3 in synchronization with the fourth data strobe signal DQS4 and the fourth data mask signal DM4 when a write operation is performed in the swap mode. The third write path circuit 83 is also configured to write the eight bits of input data DIN<9:16> transmitted from the third selection transfer unit 73 to the memory core 3 in synchronization with the third data strobe signal DQS3 and the third data mask signal DM3, when a write operation is performed in the X16 or X32 mode.

The fourth write path circuit 84 is configured to write the eight bits of input data DIN<25:32> transmitted from the fourth selection transfer unit 74 to the memory core 3 in synchronization with the fourth data strobe signal DQS4 and the fourth data mask signal DM4, when a write operation is performed in the X32 mode.

The operation of the semiconductor memory chip configured in the above-described manner may comprise a write operation in the X32 mode, the X16 mode, and the swap mode, and a read operation in the X32 mode, the X16 mode, and the swap mode.

When a read operation is performed in the X32 mode, the first multiplexer 41 multiplexes received data from the memory core 3 and outputs the multiplexed data to the first pad unit 61 through the first read path circuit 51. Furthermore, the second multiplexer 42 multiplexes received data from the memory core 3 and outputs the multiplexed data to the second pad unit 62 through the second read path circuit 52. Furthermore, the third multiplexer 43 multiplexes received data from the memory core 3 and outputs the multiplexed data to the third pad unit 63 through the third read path circuit 53. Furthermore, the fourth multiplexer 44 multiplexes received data from the memory core 3 and outputs the multiplexed data to the fourth pad unit 64 through the fourth read path circuit 54.

When a write operation is performed in the X32 mode, the first write path circuit 81 writes the eight bits of input data DIN<1:8> transmitted from the first selection transfer unit 71 to the memory core 3 in synchronization with the first data strobe signal DQS1 and the first data mask signal DM1. Furthermore, the second write path circuit 82 writes the eight bits of input data DIN<9:16> transmitted from the second selection transfer unit 72 to the memory core 3 in synchronization with the second data strobe signal DQS2 and the second data mask signal DM2. Furthermore, the third write path circuit 83 writes the eight bits of input data DIN<17:24> transmitted from the third selection transfer unit 73 to the memory core 3 in synchronization with the third data strobe signal DQS3 and the third data mask signal DM3. Furthermore, the fourth write path circuit 84 writes the eight bits of input data DIN<25:32> transmitted from the fourth selection transfer unit 74 to the memory core 3 in synchronization with the fourth data strobe signal DQS4 and the fourth data mask signal DM4.

When a read operation is performed in the X16 mode, the second multiplexer 42 multiplexes received data from the memory core 3 and outputs the multiplexed data to the second pad unit 62 through the second read path circuit 52. Furthermore, the third multiplexer 43 multiplexes received data from the memory core 3 and outputs the multiplexed data to the third pad unit 63 through the third read path circuit 53. During this time, the first and fourth multiplexers 41 and 44 are stopped from transmitting data.

When a write operation is performed in the X16 mode, the second write path circuit 82 writes the eight bits of input data DIN<9:16> transmitted from the second selection transfer unit 72 to the memory core 3 in synchronization with the second data strobe signal DQS2 and the second data mask signal DM2. Furthermore, the third write path circuit 83 writes the eight bits of input data DIN<17:24> transmitted from the third selection transfer unit 73 to the memory core 3 in synchronization with the third data strobe signal DQS3 and the third data mask signal DM3. At this time, the first and fourth selection transfer units 71 and 74 do not transmit input data, a data strobe signal, and a data mask signal.

When a read operation is performed in the swap mode, the first multiplexer 41 multiplexes received data from the memory core 3 and outputs the multiplexed data to the first pad unit 61 through the first read path circuit 51. Furthermore, the fourth multiplexer 44 multiplexes received data from the memory core 3 and outputs the multiplexed data to the fourth pad unit 64 through the fourth read path circuit 54. During this time, the second and third multiplexers 42 and 43 are stopped from transmitting data.

When a write operation is performed in the swap mode, the second write path circuit 82 writes the eight bits of input data DIN<1:8> transmitted from the first selection transfer unit 71 to the memory core 3 in synchronization with the first data strobe signal DQS1 and the first data mask signal DM1. Furthermore, the third write path circuit 83 writes the eight bits of input data DIN<25:32> transmitted from the fourth selection transfer unit 74 to the memory core 3 in synchronization with the fourth data strobe signal DQS4 and the fourth data mask signal DM4. During this time, the second and third selection transfer units 72 and 73 do not transmit input data, a data strobe signal, and a data mask signal.

The semiconductor memory chip operating in the above-described manner provides the swap mode where 16 bits of data are inputted and outputted through the first pad unit 61 and the fourth pad unit 64, as well as in the X16 mode where 16 bits of data are inputted and outputted through the second pad unit 62 and the third pad unit 63. That is, the swap mode is implemented in such a manner that data are inputted and outputted by using pad units different from in the X16 mode.

Figure 6:
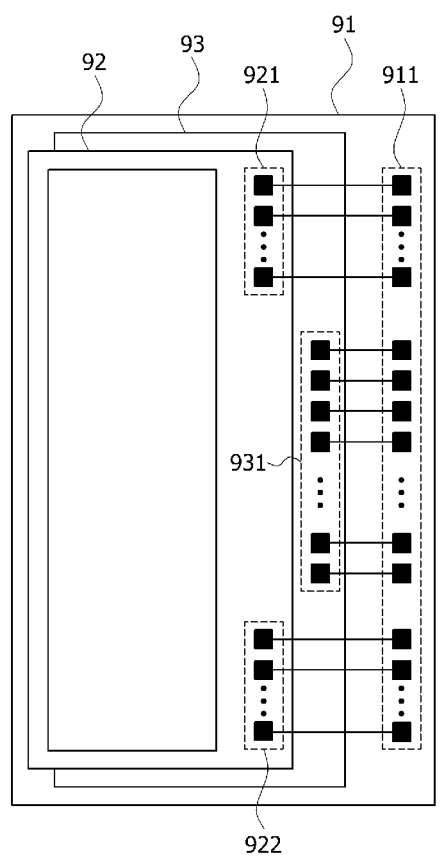
FIG. 6 is a diagram illustrating a multi-chip package implemented using a semiconductor memory chip in accordance with another embodiment of the present invention.

FIG. 6 is a diagram illustrating a multi-chip package implemented by using semiconductor memory chips providing the swap mode.

Referring to FIG. 6, the multi-chip package 91 in accordance with an embodiment of the present invention includes a first semiconductor memory chip 92 and a second semiconductor memory chip 93. The first semiconductor memory chip 16 may be set to perform a read operation and a write operation in the swap mode, and the second semiconductor memory chip 17 may be set to perform a read operation and a write operation in the X16 mode, thereby implementing the multi-chip package 91 operating in the X32 mode. Therefore, the first semiconductor memory chip 16 performing a read operation and a write operation in the swap mode inputs and outputs data through pad units 921 and 922, and the second semiconductor memory chip 17 performing a read operation and a write operation in the X16 mode inputs and outputs data through a pad unit 931.

As the multi-chip package 91 is implemented by using the first semiconductor memory chip 92 providing the swap mode, the angle of a bonding for coupling the pad units 921 and 922 of the first semiconductor memory chip 92 to the pad unit 911 of the multi-chip package 91 does not increase. Furthermore, it is easy to compensate for a loading difference between a signal transferred through a bonding for coupling the pad units 921 and 922 of the first semiconductor memory chip 92 to the pad unit 911 of the multi-chip package 91 and a signal transferred through a bonding for coupling the pad unit 931 of the second semiconductor memory chip 93 to the pad unit 911 of the multi-chip package 91.

While FIG. 3 has been drawn generally to show the multiplexers 41, 42, 43, and 44 having four inputs of 8-bit words, the invention need not be so limited. For example, the number of 8-bit inputs to the multiplexers 41, 42, 43, and 44 may be reduced to having less than four inputs 8-bit words. Furthermore, various embodiments of the invention can support different types of data access during a X16 or swap read/write. For example, during a X16 or swap mode, data may be output by the memory core 3 as 16 bits, or the data may be output by the memory core 3 as 32 bits, of which 16 bits at a time are output to the appropriate pad units 61-64. Similarly, during a X16 or swap mode, data may be written 16 bits at a time to the memory core 3, or two 16 bits of data may be gathered to write a 32 bit data to the memory core 3. Examples are given below.

As an example, data from the memory core 3 may be accessed 32-bits at a time and transmitted to the pad units 61, 62, 63, and 64 either 32 bits at a time in X32 mode or 16 bits at a time in X16 or swap modes. The 32-bit word read from the memory core 3 can be referred to as comprising Byte1, Byte2, Byte3, and Byte4, where Byte1 is the least significant byte (LSB) and Byte 4 is the most significant byte (MSB). In one exemplary configuration, the first 16 bits may comprise Byte1 and Byte2, and the second 16 bits may comprise Byte3 and Byte 4.

When reading data in the X32 mode, the 32 bits may be output via a first, second, third, and fourth sets of output nodes of the memory core 3. These four sets of output nodes, though not labeled, are shown as the four outputs of the memory core 3 in FIG. 3. The first multiplexer 41 may output Byte1 from the first set of output nodes, the second multiplexer 42 may output Byte2 from the second set of output nodes, the third multiplexer 43 may output Byte3 from the third set of output nodes, and the fourth multiplexer 44 may output Byte4 from the fourth set of output nodes.

When reading data in the X16 mode, the 32-bit word is transmitted 16 bits at a time. For example, the first 16 bits may comprise Byte1 from the multiplexer 42 and Byte2 from the multiplexer 43, where Byte1 and Byte2 are from the first and second sets of output nodes, respectively. The second 16 bits may comprise Byte3 from the multiplexer 42 and Byte4 from the multiplexer 43, where Byte3 and Byte4 are from the third and fourth sets of the output nodes, respectively.

In the swap mode, the 32-bit word is also transmitted 16 bits at a time. Similarly as in the X16 mode, the first 16 bits may comprise Byte1 from the multiplexer 41 and Byte2 from the multiplexer 44, where Byte1 and Byte2 are from the first and second sets of output nodes, respectively. The second 16 bits may comprise Byte3 from the multiplexer 41 and Byte4 from the multiplexer 44, where Byte3 and Byte4 are from the third and fourth sets of the output nodes, respectively.

Accordingly, it can be seen that the first multiplexer 41 receives data from the first set of output nodes and the third set of output nodes, and the second multiplexer 42 receives data from the first, second, and third sets of output nodes. The third multiplexer 43 receives data from the second, third, and fourth sets of output nodes, and the fourth multiplexer 44 receives data from the second and fourth sets of output nodes. Therefore, the first multiplexer 41 and the fourth multiplexer 44 may multiplex two sets of inputs while the second multiplexer 42 and the third multiplexer 43 may multiplex three sets of inputs.

As another example, data from the memory core 3 may be accessed from the memory core 3 either 32-bits at a time in X32 mode or 16 bits at a time in X16 or swap modes. In X32 mode, the 32-bit word is accessed from the memory core 3 similarly as described above. However, in X16 or swap mode, the data from the memory core 3 may be output 16 bits at a time via the second and third sets of output nodes while the first and fourth sets of output nodes are unused.

When reading data in the X16 mode, the 16-bit word is output by the memory core only 16 bits at a time via the second and third sets of output nodes. Accordingly, the 16 bits of data may be communicated to the pad units 62 and 63. In the swap mode, each of the eight-bit bytes at the second and third sets of output nodes is communicated to the pad units 61 and 64, respectively.

Accordingly, it can be seen that the first multiplexer 41 receives data from the first set of output nodes and the third set of output nodes, and the second multiplexer 42 receives data from the second set of output nodes. The third multiplexer 43 receives data from the third set of output nodes, and the fourth multiplexer 44 receives data from the third and fourth sets of output nodes. Therefore, the first multiplexer 41 and the fourth multiplexer 44 may multiplex two sets of inputs while the second multiplexer 42 and the third multiplexer 43 need not multiplex.

Other configurations may require different groupings of 8-bit data to each of the four multiplexers. A specific configuration used by different embodiments of the invention may be design dependent.

In an embodiment of the present invention, it has been described that two semiconductor memory chips providing the swap mode and the X16 mode are used to implement the multi-chip package. According to exemplary embodiments, however, a plurality of semiconductor memory chips providing a swap mode for various data output modes may be used to implement a multi-chip package.

The embodiments of the present invention have been disclosed above for illustrative purposes. Those skilled in the art will appreciate that various modifications, additions, and substitutions are possible, without departing from the scope and spirit of the invention as disclosed in the accompanying claims.

What is claimed is:

1. A semiconductor memory chip comprising:
   a first pad unit configured to receive a first data and a first strobe signal;
   a second pad unit configured to receive a second data and a second strobe signal;
   a first selection transfer unit configured to transfer the first data and the first strobe signal to a first write path circuit in a first mode, and transfer the first data and the first strobe signal to a second write path circuit in a second mode; and
   a second selection transfer unit configured to transfer the second data and the second strobe signal to the second write path circuit in the first mode and a third mode.

2. The semiconductor memory chip of claim 1, wherein the first write path circuit is configured to write the first data into a memory core in response to the first strobe signal in the first mode.

3. The semiconductor memory chip of claim 2, wherein the second write path circuit is configured to write the first data into the memory core in response to the first strobe signal in the second mode.

4. The semiconductor memory chip of claim 1, wherein the second write path circuit is configured to write the second data signal into a memory core in response to the second strobe signal in the first and third modes.

5. A semiconductor memory chip comprising:
- a first multiplexer configured to multiplex data from a memory core and output the multiplexed data to a first pad unit through a first read path circuit in a first mode and a second mode;
- a first selection transfer unit configured to transfer a first data and a first strobe signal, which are inputted through the first pad unit, to a first write path circuit in the first mode, and transfer the first data and the first strobe signal to a second write path circuit in the second mode; and
- a second selection transfer unit configured to transfer a second data and a second strobe signal, which are inputted through a second pad unit, to the second write path circuit in the first mode and a third modes.

6. The semiconductor memory chip of claim 5, wherein the first write path circuit is configured to write the first data to the memory core in response to the first strobe signal in the first mode.

7. The semiconductor memory chip of claim 6, wherein the second write path circuit is configured to write the first data signal to the memory core in response to the first strobe signal in the second mode.

8. The semiconductor memory chip of claim 5, further comprising a second multiplexer configured to multiplex data from the memory core and output the multiplexed data to the second pad unit through a second read circuit in the first mode and the second mode.

9. The semiconductor memory chip of claim 5, wherein the second write path circuit is configured to write the second data to the memory core in response to the second strobe signal in the first and third modes.

10. A multi-chip package configured to receive a first, second, third, and fourth data and a first, second, third, and fourth strobe signals, comprising:
- a first semiconductor memory chip comprising:
  - a first selection transfer unit configured to transfer the first data and the first strobe signal, which are inputted through a first pad unit, to a first write path circuit in a first mode, and transfer the first data signal and the first strobe signal to a second write path circuit in a second mode; and
  - a second selection transfer unit configured to transfer the second data and the second strobe signal, which are inputted through a second pad unit, to the second write path circuit in the first mode and a third mode;
- a second semiconductor memory chip comprising:
  - a first selection transfer unit configured to transfer the third data and the third strobe signal, which are inputted through a first pad unit, to a first write path circuit in the first mode, and transfer the third data and the third strobe signal to a second write path circuit in the second mode; and
  - a second selection transfer unit configured to transfer the fourth data and the fourth strobe signal, which are inputted through a second pad unit, to the second write path circuit in the first and third modes; and
- a package pad unit coupled to the first and second pad units of the first semiconductor memory chip and to the first and second pad units of the second semiconductor memory chip.

11. The multi-chip package of claim 10, wherein the first semiconductor memory chip operates in the second mode, and the second semiconductor memory chip operates in the third mode.

12. The multi-chip package of claim 10, wherein, in the first semiconductor memory chip, the second write path circuit is configured to write the first data to a memory core in response to the first strobe signal.

13. The multi-chip package of claim 10, wherein, in the second semiconductor memory chip the second write path circuit is configured to write the fourth data to a memory core in response to the fourth strobe signal.

14. The multi-chip package of claim 10, further comprising, in the first semiconductor memory chip operating in the second mode, a first multiplexer configured to multiplex first data from a memory core and output first multiplexed data to the first pad unit via a first read path circuit, and a second multiplexer configured to multiplex second data from the memory core and output second multiplexed data to the second pad unit via a second read path circuit.

15. The multi-chip package of claim 10, further comprising, in the second semiconductor memory chip operating in the third mode, a first multiplexer configured to multiplex first data from a memory core and output first multiplexed data to the first pad unit via a first read path circuit, and a second multiplexer configured to multiplex second data from the memory core and output second multiplexed data to the second pad unit via a second read path circuit.

* * * * *